(12) United States Patent
Lee et al.

(10) Patent No.: US 6,750,725 B2
(45) Date of Patent: Jun. 15, 2004

(54) APPARATUS FOR DETECTING PHASE ERROR BY USING ZERO CROSSING CHARACTERISTICS OF INPUT SIGNAL, AND PHASE LOCKED LOOP CIRCUIT USING THE SAME

(75) Inventors: Jae-Wook Lee, Osan (KR); Seok-Jun Ko, Suwon (KR); Pan-Soo Kim, Suwon (KR); Hyung-Jin Choi, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/190,600

(22) Filed: Jul. 9, 2002

(65) Prior Publication Data

US 2003/0062955 A1 Apr. 3, 2003

(30) Foreign Application Priority Data

Jul. 9, 2001 (KR) ........................................ 2001-41016

(51) Int. Cl.⁷ ................................................ H03L 7/00
(52) U.S. Cl. ........................................ 331/1 A; 327/156
(58) Field of Search ..................... 331/1 A, 17, DIG. 2; 327/2, 12, 146, 147, 150, 155, 156, 159, 163; 341/155; 375/371, 375–376

(56) References Cited

U.S. PATENT DOCUMENTS

| | | | | |
|---|---|---|---|---|
| 5,267,267 A | * | 11/1993 | Kazawa et al. | 375/294 |
| 5,488,636 A | * | 1/1996 | Yamada et al. | 375/340 |
| 5,748,045 A | * | 5/1998 | Tateishi | 331/17 |
| 5,790,607 A | * | 8/1998 | Burke et al. | 375/355 |
| 6,460,001 B1 | * | 10/2002 | Yamaguchi et al. | 702/69 |
| 6,542,039 B1 | * | 4/2003 | Ogura | 331/11 |
| 6,598,004 B1 | * | 7/2003 | Ishida et al. | 702/69 |

* cited by examiner

Primary Examiner—My-Trang Nuton
(74) Attorney, Agent, or Firm—Sughrue Mion, PLLC

(57) ABSTRACT

An apparatus for detecting a phase error for a system such as a CD or a DVD having a multi-level input signal with an irregular zero crossing shift, and a phase locked loop circuit using the same. An A/D converter digitizes a signal read from the CD or the DVD. A phase error detect unit detects a zero crossing of the digital signal consecutively input from the A/D converter, and detects a timing error from a signal corresponding to the detected zero crossing. An error correction unit corrects a sampling timing error of the A/D converter by shifting a phase corresponding to the timing error input from the phase error detect unit. An apparatus for detecting a timing error having a tracking function reduces the amount of normal jitter and a dispersion value of the timing error in accordance with a signal to noise ratio.

15 Claims, 8 Drawing Sheets

APPARATUS FOR DETECTING PHASE ERROR BY USING ZERO CROSSING CHARACTERISTICS OF INPUT SIGNAL, AND PHASE LOCKED LOOP CIRCUIT USING THE SAME

BACKGROUND OF THE INVENTION

1. Field of the Invention

The present invention relates to an apparatus for detecting a phase error of an input signal and a phase locked loop circuit using the same, and more particularly to an apparatus for detecting a phase error in accordance with a frequency and a phase change of a signal read from a disk-type storage medium, and a phase locked loop circuit using the same. The present application is based on Korean Application No. 2001-41016, filed Jul. 9, 2001, which is incorporated herein by reference.

2. Description of the Related Art

A system for recording and reproducing a signal to and from a disk-type storage medium such as a CD or a DVD records and reproduces the signal by rotating the disk-type storage medium at an equiangular velocity. In the system for recording and reproducing the signal by rotating at the equiangular velocity, when inside tracks, which are located at a center of a radius of the disk-type storage medium, are read, the linear velocity is slow. On the contrary, when outside tracks, which are located at an outer circumference of the radius, are read, the linear velocity is fast. Therefore, since a frequency between the inside tracks and the outside tracks of the disk-type storage medium varies over a large range, there is a need to use an algorithm, which is capable of improving a tracking function by detecting an exact timing error of a receiving signal, which is read from the disk-type storage medium, at a receiving end of the recording and reproducing system.

One example of the algorithm is the M&M (K. H. Mueller and M. Muller) method. The M&M method is disclosed in a thesis entitled "Timing recovery in digital synchronous data receiver" (IEEE Trans. Commun., vol. COM-14, pp.516–530, May 1976.)

FIG. 1 is a block diagram showing a structure of a conventional phase locked loop circuit according to the M&M method.

Referring to FIG. 1, the phase locked loop circuit is an apparatus for detecting a timing error and compensating for the timing error. The phase locked loop circuit 1 (hereinafter, referred to as a PLL) detects the timing error from the receiving signal, and synchronizes an input timing and a sampling timing of the receiving signal by compensating the timing error. The timing error in a time domain has the same meaning as a phase error in a frequency domain, thus the timing error and the phase error will be understood to have corresponding meanings hereinafter.

The PLL 1 comprises an A/D converter 10, a phase error detect unit 14, a low pass filter 16, a D/A converter 17, and a voltage controlled oscillator 18 (hereinafter, referred to as a VCO). The A/D converter 10 converts an analog signal into a digital signal. The phase error detect unit 14 detects the phase error from the digital signal input from the A/D converter 10.

The low pass filter 16 removes high frequency noise included in the detected phase error. The D/A converter 17 converts the phase error passed through the low pass filter 16 into an analog signal. The VCO 18 compensates the sampling timing of the A/D converter 10 in accordance with the detected phase error. The PLL 1 includes an interpolation unit 5 for compensating an output characteristic of the PLL 1 to match a system incorporating the PLL 1, for example an optical disk system.

A signal read from each track of the disk-type storage medium, such as a CD or a DVD, by an optical pickup that reproduces the signal from the disk-type storage medium is consecutively input to the A/D converter 10 of the PLL 1. The A/D converter 10 converts the analog signal input from the optical pickup into a digital signal.

The phase error detect unit 14 consecutively receives the digital signal from the A/D converter 10 and obtains the timing error using a method which will be described later. The timing error obtained by the phase error detect unit 14 is input to the low pass filter 16. The low pass filter 16 removes the high frequency noise from the received timing error and inputs the filtered response to the D/A converter 17.

The D/A converter 17 converts the phase error signal, from which the noise has been removed, into an analog signal. The VCO 18 shifts the phase in accordance with the phase error signal to compensate the timing error of the received signal. A/D converter 10 converts the received analog signal into the digital signal at the sampling timing that has been compensated by the shifted phase. The interpolation unit 5 receives the digital signal converted in accordance with the compensated sampling timing, and outputs a controlled signal to match the optical disk system.

According to the described M&M algorithm, the timing error is detected by a mathematical expression 1.

$$Z_k = 0.5(X_k a_{k-1} - X_{k-1} a_k) \qquad \text{[Mathematical expression 1]}$$

FIG. 2 is a block diagram showing the result of the above expression. Referring to FIG. 2, the phase error detect unit 14 comprises a quantization unit 142, a pair of buffers 141 and 143, two multipliers 144 and 145, a subtractor 146, and an amplifier 147.

The buffer 141 receives the digital signal from the A/D converter 10 and stores the digital signal. After the digital signal $x_{k-1}$ is input, if a new digital signal $x_k$ is input, the digital signal $x_{k-1}$ is stored in the buffer 141.

The quantization unit 142 receives a new digital signal $x_k$ from the A/D converter 10, and outputs a value $a_k$, which has been 2-value quantized as +1 or −1 in accordance with the digital signal value, to buffer 143. At this time, an output value $a_{k-1}$ of the quantization unit 142 by the digital signal $x_{k-1}$ is stored in the buffer 143. The multiplier 144 receives the output value $x_{k-1}$ of the buffer 141 and the output value $a_k$ of the quantization unit 142 based on the new digital signal $x_k$.

The multiplier 145 receives the output value $x_k$ of the A/D converter 10 and the output value $a_{k-1}$ of the buffer 143. The subtractor 146 obtains the timing error by receiving the value of the multipliers 144 and 145. The amplifier 147 amplifies the obtained timing value by a factor of a half.

FIG. 3 is a graph showing a characteristic of the phase error detect unit 14 of FIG. 2. Referring to FIG. 3, a dotted line "A" illustrates an ideal distribution of a timing function value. The straighter the line, the greater is the probability for the timing function value to detect the timing error.

However, a conventional timing function value is shown as an s-type solid line "R". In other words, the conventional timing function value does not satisfy the linear characteristic. The conventional apparatus for detecting a timing error detects the timing error for every sampling clock.

Moreover, as shown in FIG. 8, when the conventional apparatus for detecting a timing error is used, noise generates a large dispersion value in a steady status, when tracking the phase error. In other words, if there is much noise, the error generating probability around the real error value is also high.

In addition, as shown in FIG. 9, when the conventional apparatus for detecting a timing error is used, a normal jitter value is large when tracking the timing error. Therefore, the function of the conventional apparatus for detecting a timing error cannot be assured when a multi-level signal is transmitted in the baseband. Also, when the signal to noise ratio is low, the function cannot be assured.

Moreover, the CD and the DVD system use a run-length limited code signal that is a zero crossing shift of the signal. The signal is irregular and is multi-level. However, when the conventional apparatus for detecting timing error is used, the timing error value is shown in every sampling clock. Thus, there is a problem that the dispersion values of the data sample values show a considerably great variation value in accordance with the influence of the SNR (signal to noise ratio), as shown in FIG. 8 by lines B1, B2, and B3.

SUMMARY OF THE INVENTION

The present invention has been made to overcome the above-mentioned problems. Thus, an object of the present invention is to provide an apparatus for detecting a phase error capable of assuring a predetermined function even when an input signal having multiple levels and an irregular zero crossing is used, and a phase locked loop circuit using the same.

The above object is accomplished by providing an apparatus for detecting a phase error comprising a zero crossing detect unit for detecting a zero crossing of digital signals consecutively input; a switching unit for transmitting the consecutively input digital signals when the zero crossing is detected by the zero crossing detect unit; and an error calculate unit for obtaining and outputting timing error between a timing of a present signal input from the switching unit and an input timing of a previous signal for the present signal.

In addition, the above object is accomplished by providing a phase locked loop circuit comprising an A/D converter for converting signals that are consecutively input into digital signals; a phase error detect unit for detecting a zero crossing of the digital signals that are consecutively input from the A/D converter and for detecting a timing error from the signal corresponding to the zero crossing; and an error correction unit for correcting a sampling timing of the A/D converter corresponding to the timing error that has been input from the phase error detect unit.

The phase locked loop circuit is constructed to further include an interpolation unit for outputting an average of a signal output from the A/D converter after the sampling timing is adjusted.

According to the phase locked loop circuit described above, the phase error is calculated only when the zero crossing is detected. Therefore, even when the input signal is a multi-level signal and has an irregular zero crossing, a predetermined function is assured.

BRIEF DESCRIPTION OF THE DRAWINGS

The above-mentioned object and features of the present invention will be more apparent by describing the preferred embodiment of the present invention by referring to the appended drawings, in which.

DETAILED DESCRIPTION OF THE PREFERRED EMBODIMENT

From now on, the preferred embodiment of the present invention will be described in great detail by referring to the appended drawings.

Figure 1:
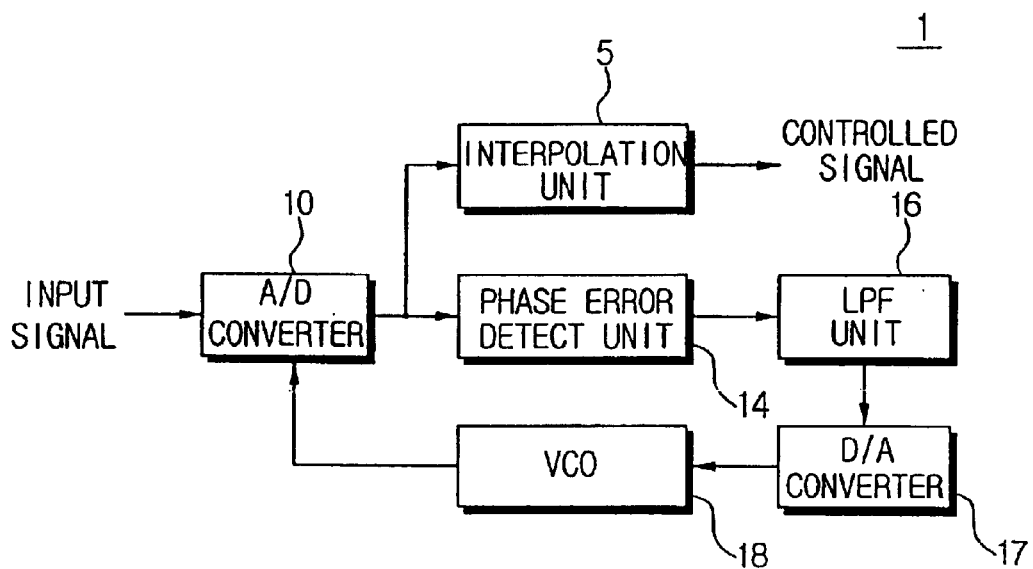
FIG. 1 is a block diagram showing a structure of a conventional phase locked loop circuit.
Figure 2:
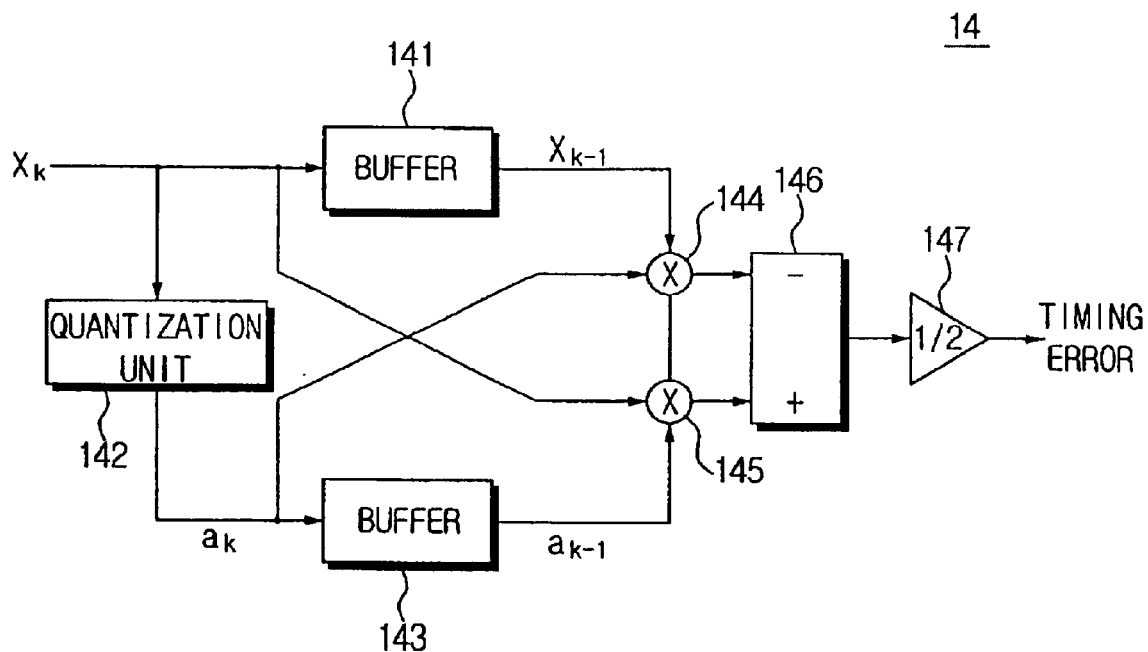
FIG. 2 is a block diagram showing a structure of a phase error detect unit of FIG. 1 in great detail.
Figure 3:
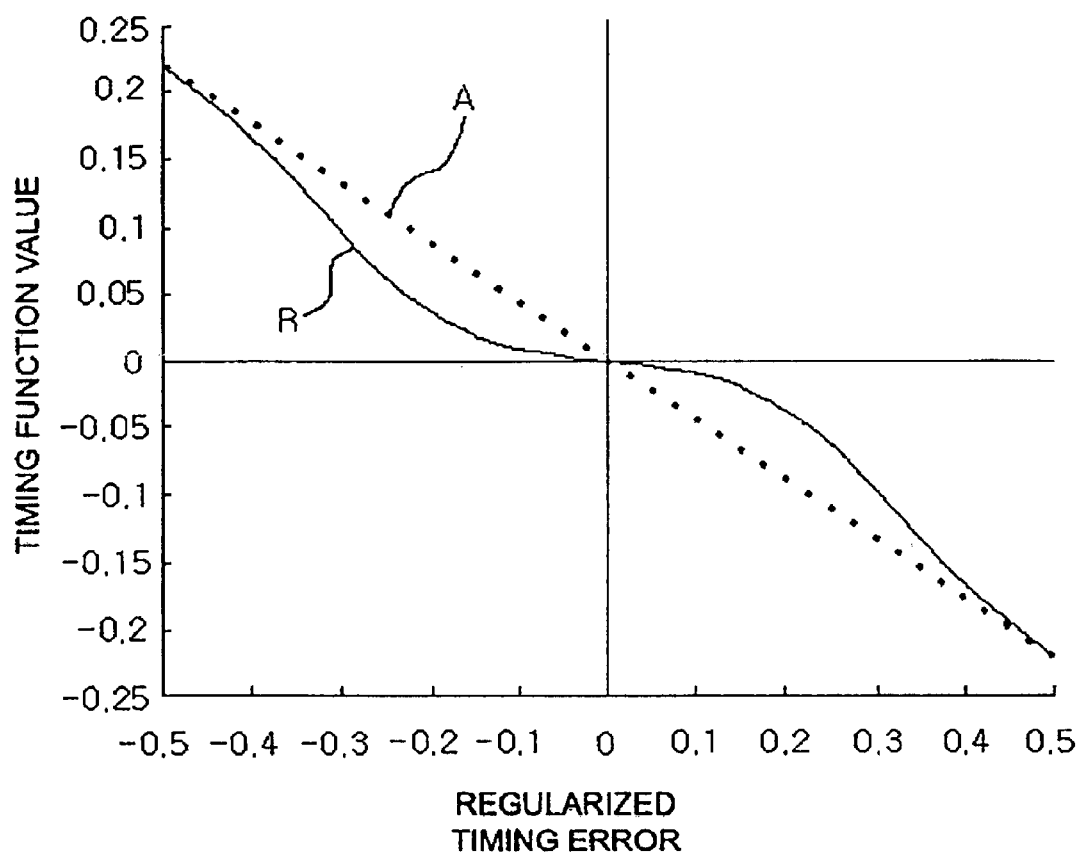
FIG. 3 is a graph showing a characteristic of the phase error detect unit of FIG. 2.
Figure 4:
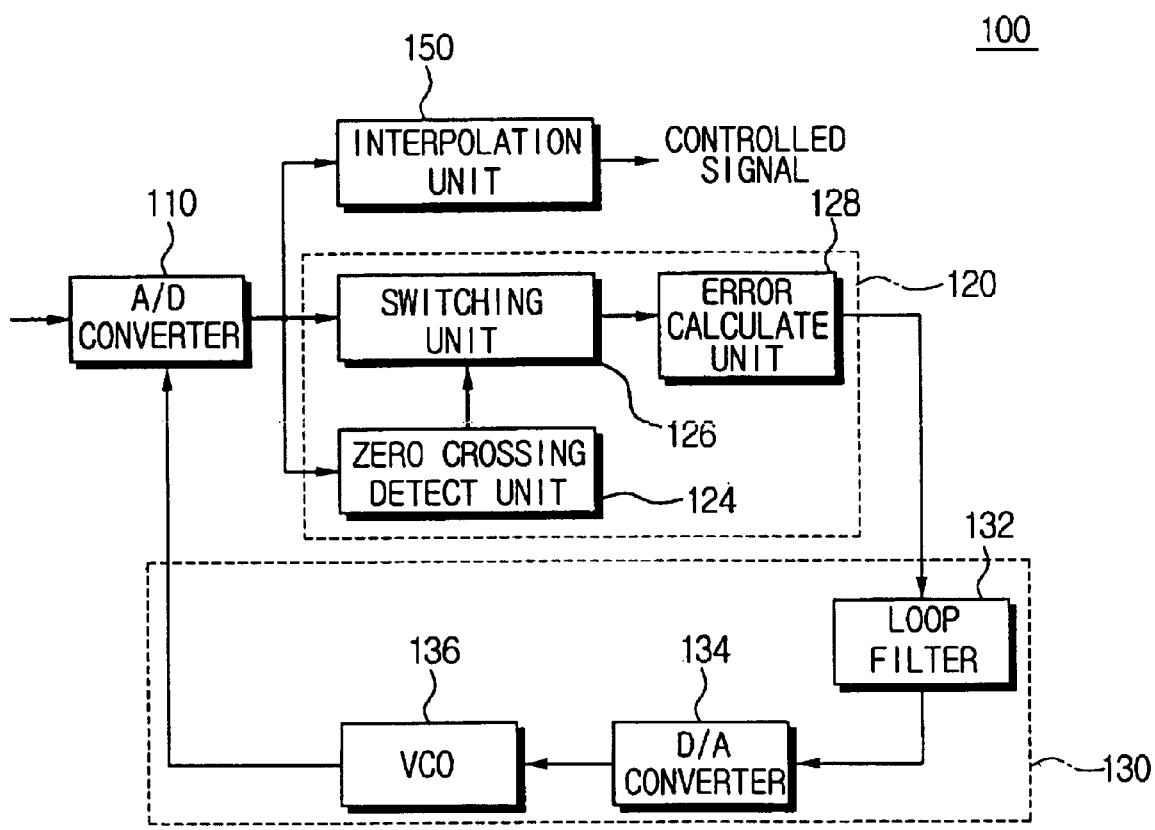
FIG. 4 is a block diagram showing a structure of a phase locked loop circuit according to the preferred embodiment of the present invention.

FIG. 4 is a block diagram showing the construction of a phase locked loop circuit according to the preferred embodiment of the present invention.

Referring to FIG. 4, the phase locked loop circuit 100 for detecting and correcting a timing error includes an A/D converter 110, a phase error detect unit 120, an error correction unit 130, and an interpolation unit 150. The A/D converter 110 converts signals consecutively input to digital signals. The phase error detect unit 120 includes a zero crossing detect unit 124, a switching unit 126, and an error calculate unit 128.

The phase error detect unit 120 detects a zero crossing of the digital signals consecutively input from the A/D converter 110, and detects the timing error from the signals corresponding to the zero crossing.

The error correction unit 130 includes a loop filter 132, D/A converter 134, and a VCO 136. The error correction unit 130 has been realized as a voltage controlled oscillator (VCO), which is a clock generator for generating a synchronizing signal. The loop filter 132 removes a noise including a high-frequency wave from a phase error signal, and a low-pass filter can be used.

The D/A converter 134 converts the phase error signal, from which the noise has been removed, to an analog signal. The VCO 136 corrects a sampling timing of the A/D converter 110 by shifting the phase corresponding to the timing error input from the phase error detect unit 120 after being passed through the loop filter 132.

The A/D converter 110 converts the received analog signal to the digital signal at the sampling timing corrected in accordance with the phase shifted by the VCO 136. The interpolation unit 150 receives the digital signal converted in accordance with the corrected sampling timing, and outputs a controlled signal in order to match to an optical disk system. The interpolation unit 150 outputs an average of the digital signal output from the A/D converter 110 in which the sampling timing is corrected.

In the preferred embodiment of the present invention, it has been described that the interpolation unit 150 is included in the phase locked loop circuit 100. However, the present invention is not limited to the preferred embodiment, but various applications can be performed. In other words, the interpolation unit 150 can be included as a component of a system capable of applying the phase locked loop circuit 100, such as a high-speed optical disk system to be matched to the high-speed optical disk.

Figure 5:
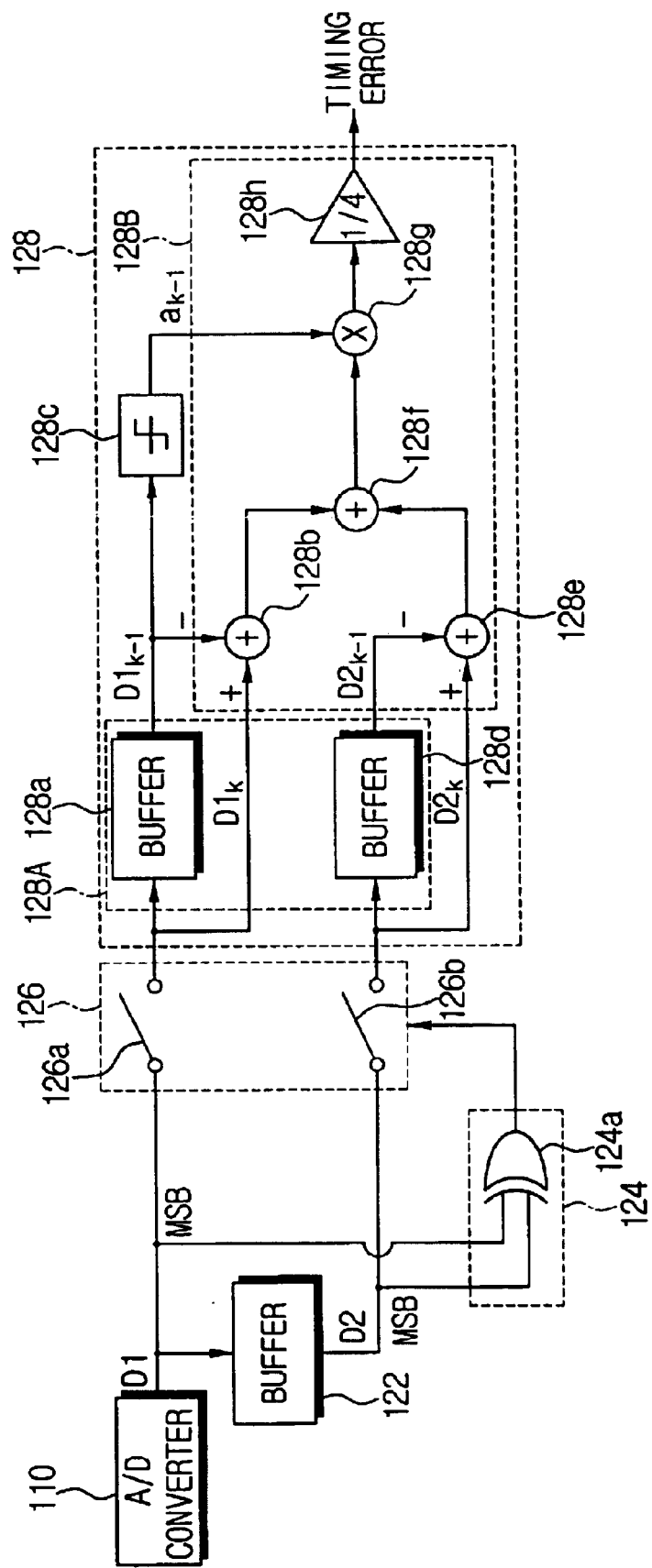
FIG. 5 is a block diagram showing a structure of the phase error detect unit of FIG. 4 in great detail.

FIG. 5 is a block diagram showing a structure of the phase error detect unit of FIG. 4 in great detail.

Referring to FIG. 5, the phase error detect unit 120 according to the present invention includes a buffer 122, a zero crossing detect unit 124, a switching unit 126, and an error calculate unit 128. The buffer 122 stores the digital signals consecutively input from the A/D converter 110.

The zero crossing detect unit 124 can be constructed as an exclusive OR gate for detecting whether or not the zero crossing is generated between a sign bit, i.e. a most significant bit (MSB), of the digital signal consecutively input from the A/D converter 110 and a sign bit, i.e. a most significant bit (MSB), of the digital signal consecutively output from the buffer 122.

The switching unit 126 includes first and second switches 126a and 126b for transmitting the signals input from the A/D converter 110, and the first and second switches 126a and 126b are turned on only when a zero crossing detect signal is input from the zero crossing detect unit 124. The error calculate unit 128 obtains and outputs a timing error between an input timing of a present signal input from the switching unit 126 and an input timing of a previous signal.

The error calculate unit 128 includes a relay unit 128A serially connected with the first and the second switches 126a and 126b of the switching unit 126. The relay unit 128A is for consecutively storing the digital signal consecutively input in accordance with an output signal of the zero crossing detect unit 124. In the preferred embodiment of the present invention, the relay unit 128A comprises first and second buffers 128a and 128d. A quantization unit 128c for 2-value quantizing of the digital signal consecutively output from the first buffer 128a is connected with an output end of the first buffer 128a. A calculate unit 128B is connected with an output end of the quantization unit 128c and an output end of the second buffer 128d.

The calculate unit 128B includes a first adder 128b, a second adder 128e, a third adder 128f, a multiplier 128g, and an amplifier 128h. The first adder 128b calculates a difference of the digital signal input from the first buffer 128a and the digital signal input through the first switch 126a. The second adder 128e calculates a difference of the digital signal input from the second buffer 128d and the digital signal input through the second switch 126b. The third adder 128f adds the output signal of the first adder 128b and the output signal of the second adder 128e. The multiplier 128g multiplies the output signal of the quantization unit 128c and the output signal of the third adder 128f. The amplifier 128h amplifies the output of the multiplier 128g at a predetermined level.

In the preferred embodiment of the present invention, the amplifier 128h amplifies the output of the multiplier 128g by one fourth to evaluate the function of the phase locked loop circuit 100 according to the preferred embodiment of the present invention, and the conventional phase locked loop circuit 1. However, the present invention is not limited to the above example, and various applications can be done.

For an easy description of the operation of the phase locked loop circuit 100 according to the preferred embodiment of the present invention, let us suppose as follows. The previous signal D2 and the present signal D1 of the digital signal output from the above described A/D converter 110 are consecutively input to the phase error detect unit 120. Moreover, the zero crossing detect unit 124 detects the (k)th zero crossing between the present signal D1 and the previous signal D2.

Figure 6:
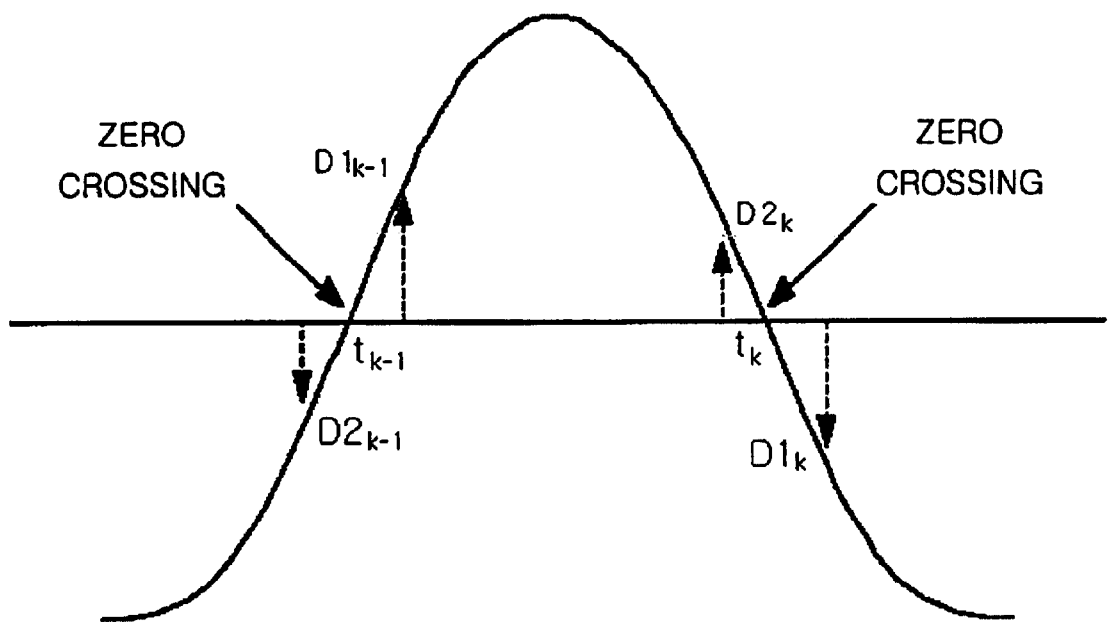
FIG. 6 is a graph showing an operation of a zero crossing detect unit of FIG. 4.

When a sample of the digital signal output from the A/D converter 110 is expressed as 6 bits, the most significant bit of the 6 bits of the digital signal is the sign bit, and the remaining 5 bits are data bits. Therefore, it is preferable that the zero crossing detect unit 124 is an exclusive OR gate that uses the sign bit as the input signal. Referring to FIG. 6, the zero crossing generates at the (k−1)th timing $t_{k-1}$ and the (k)th timing $t_k$.

Detecting the (k)th zero crossing, the zero crossing detect unit 124 drives each switch of the switching unit 126. Since the switches of the switching unit 126 are driven, the present signal $D1_k$ in the case of detecting the (k)th zero crossing is input to the first buffer 128a and the first adder 128b. In addition, the previous signal $D2_k$ in the case of detecting the (k)th zero crossing is input to the second buffer 128d and the second adder 128e.

The first adder 128b obtains the difference between the present signal $D1_k$ in accordance with the detecting of the (k)th zero crossing and the digital signal $D1_{k-1}$ in accordance with the (k−1)th zero crossing stored in the buffer 128a when the (k−1)th zero crossing is detected. The above can be expressed mathematically as follows.

$$X1_k = D1_k - D1_{k-1}$$  [Mathematical expression 2]

The second adder 128e obtains the difference between the previous signal $D2_k$ in accordance with the detecting of the (k)th zero crossing and the digital signal $D2_{k-1}$ in accordance with the (k−1)th zero crossing stored in the second buffer 128d when the (k−1)th zero crossing is detected.

$$X2_k = D2_k - D2_{k-1}$$  [Mathematical expression 3]

The third adder 128f outputs a result of adding the output signal $X1_k$ of the first adder 128b and the output signal $X2_k$ of the second adder 128e to the multiplier 128g. On the other hand, the quantization unit 128c outputs the 2-level quantized value $a_{k-1}$ of the digital signal $D1_{k-1}$ stored in the first buffer 128a when the (k−1)th zero crossing is detected. The multiplier 128g multiplies the output signal of the third adder 128f and the output signal of the quantization unit 128c. The amplifier 128h outputs a gain of the multiplier 128g as a timing error $Z_k$.

[Mathematical expression 4]
$$Z_k = 1/4 \times a_{k-1}(X1_k + X2_k)$$
$$= 1/4 \times a_{k-1}(D1_k + D2_k - D1_{k-1} - D2_{k-1})$$

When calculating the timing error $Z_k$, the gain of the amplifier 128h is ¼. The reason why the gain of the amplifier 128h is ¼ is for easy demonstration of the differences in performance between the phase error detect unit 14 of the conventional phase locked loop circuit 1 and the phase error detect unit 120 of the phase locked loop circuit 100 according to the present invention is compared. In other words, the gain of the amplifier 128h is selected to make the output value of the conventional phase error detect unit 14 and the output value of the phase error detect unit 140 according to the present invention be the same but not to affect the gain of the entire phase locked loop circuit.

The timing error $Z_k$ output from the error calculate unit 128 is input to the loop filter 132 of the phase locked loop circuit 100. The loop filter 132 removes the high frequency noise included in the timing error $Z_k$, and performs more exact phase error tracking.

The timing error $Z_k$ that passed through the loop filter 132 is input to the D/A converter 134, and is converted to the analog signal. The timing error $Z_k$ converted to the analog signal is input to the VCO 136. The VCO 136 receives the timing error $Z_k$ from the error calculate unit 128, and corrects the timing error $Z_k$ of the A/D converter 110 by shifting the phase commensurate with the value of the timing error $Z_k$.

In the present invention, the phase error detect unit is realized in the phase locked loop circuit, and is so described. However, the phase error detect unit can be constructed as a separate apparatus. The phase error detect unit, which is constructed as a separate apparatus, can be applied to other areas of the system that detect the phase error, and not only to the phase locked loop circuit. For example, the phase locked loop circuit according to the present invention can be applied to a reproducing unit for reproducing a recorded signal at a hard disk or a receiving end of a communication system using a RLL (Run-Length Limited) code.

Moreover, in the preferred embodiment of the present invention, the phase locked loop circuit has been constructed by mixing an analog circuit and a digital circuit, but the phase locked loop circuit easily can be constructed as only a digital circuit. For example, when the phase locked loop circuit is realized as a digital circuit, the A/D converter 110 converts the input analog signal to a digital signal in accordance with the clock that is oscillated by a crystal. The output of the A/D converter 110 is input to a digital interpolator. The phase error detect unit 120 detects the phase error from the signal of the digital interpolator. The detected phase error goes back to the digital interpolator after passing through the loop filter realized as a digital low-pass filter. The digital low-pass filter removes the high frequency noise from the detected phase error. The digital interpolator outputs the phase-error-corrected signal as described above.

Figure 7:
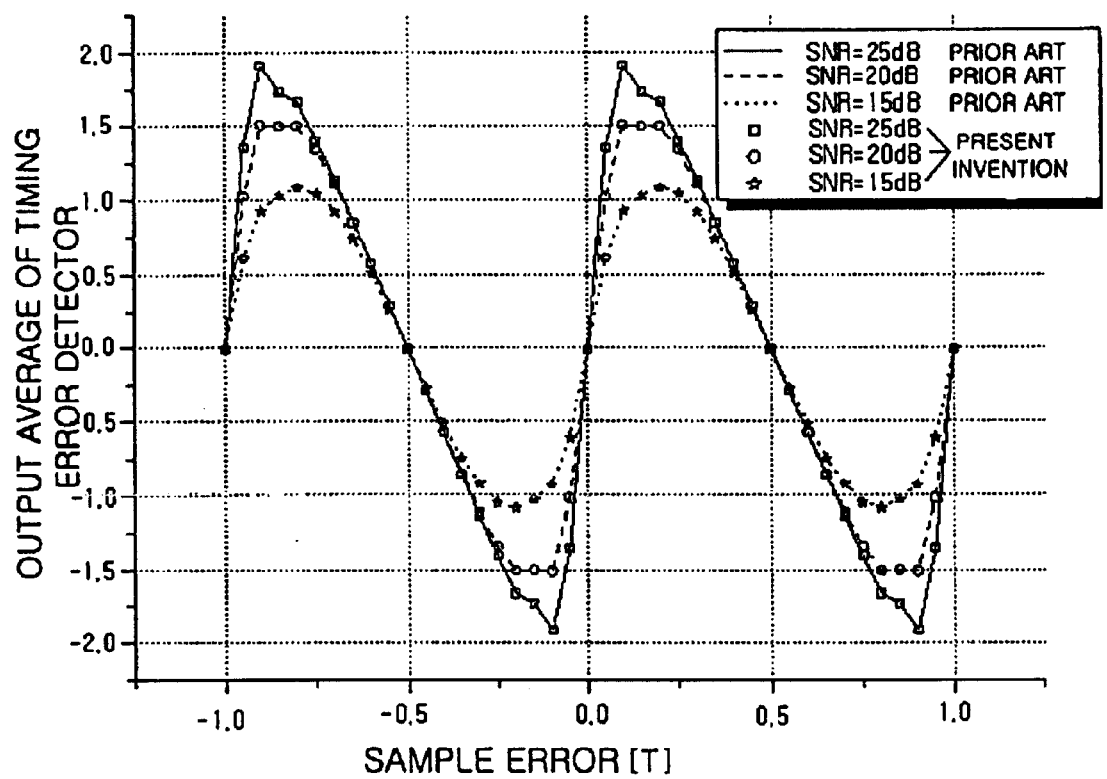
FIG. 7 is a graph showing the result of comparison of the performance of output average of a conventional phase error detect method and the preferred embodiment of the present invention.
Figure 8:
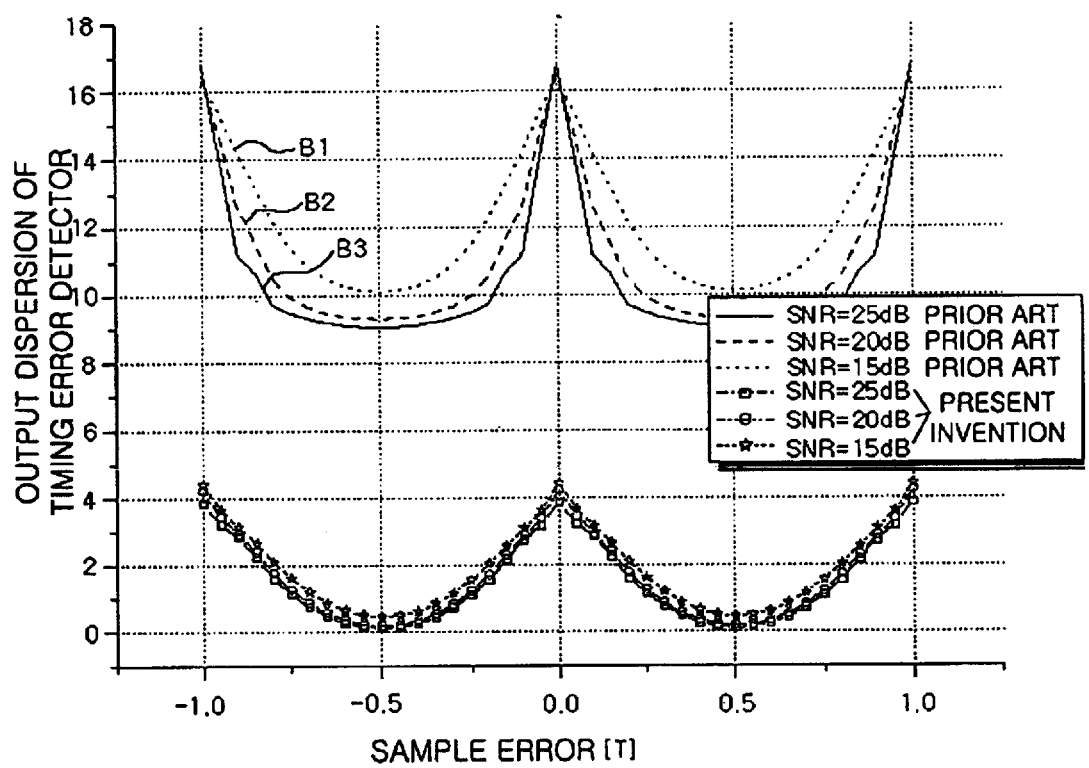
FIG. 8 is a graph showing the result of comparison of the performance of output dispersion of a conventional phase error detect method and the preferred embodiment of the present invention.
Figure 9:
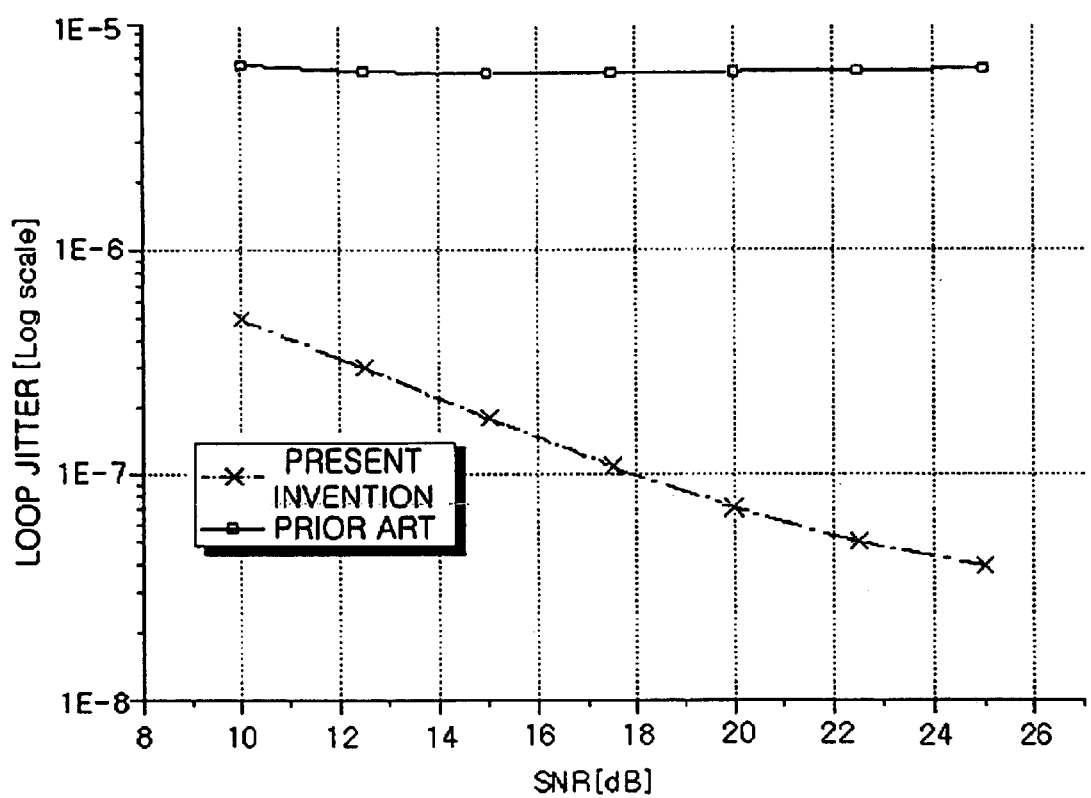
FIG. 9 is a graph showing the result of comparison of a normal jitter performance of a conventional phase error detect method and the preferred embodiment of the present invention.

Referring to FIGS. 7 through 9, the function of the apparatus for detecting timing error according to the present invention and the conventional apparatus for detecting timing error will be compared.

In FIG. 7, a solid line, a long dotted line, and a short dotted line indicate the respective output averages of the conventional apparatus for detecting timing error in the case of SNR of 25 dB, 20 dB, and 15 dB. On the other hand, □, Δ, and ☆ indicate the respective output averages of the apparatus for detecting timing error of the preferred embodiment of the present invention in the case of SNR of 25 dB, 20 dB, and 15 dB. As shown in FIG. 7, the output average of the conventional apparatus for detecting timing error and the output average of the apparatus for detecting timing error of the preferred embodiment of the present invention are very similar.

In FIG. 8, a solid line, a long dotted line, a short dotted line indicate respective output dispersions of the conventional apparatus for detecting timing error in the case of SNR of 25 dB, 20 dB, and 15 dB. On the other hand, □ on a one-dotted chain line, ○on two-dotted chain line, and ☆ on three-dotted chain line indicate respectively output dispersions of the apparatus for detecting timing error of the preferred embodiment of the present invention in the case of SNR of 25 dB, 20 dB, and 15 dB. As shown in FIG. 8, the output dispersion value of the conventional apparatus for detecting timing error has a value higher than 9, and the range of the output dispersion (9–16) is very broad. On the other hand, the output dispersion value of the apparatus for detecting timing error according to the present invention has a value less than 5, and the range of the output dispersion (0–4) is ¼ of the conventional apparatus.

In FIG. 9, □ on the straight line indicates the conventional loop jitter, and X on the one-dotted chain line indicates the loop jitter according to the present invention. As shown in FIG. 9, the conventional loop jitter has a higher value compared to the loop jitter according to the present invention. Moreover, while the conventional loop jitter has a constant loop jitter value even though the SNR increases, the loop jitter according to the present invention has a characteristic that the loop jitter value decreases as the SNR increases.

As described above, according to the present invention, the timing error is detected only when the zero crossing is detected. Accordingly, the characteristic of the output average of the conventional apparatus for detecting timing error and the apparatus for detecting timing error according to the present invention is very similar. Nonetheless, the output dispersion value of the conventional apparatus for detecting timing error is more than 9, and the range of the output dispersion is very broad as 9 to 16. Meanwhile, the output dispersion value of the apparatus for detecting timing error according to the present invention is less than 5, and the range of the output dispersion is ¼ of the conventional apparatus as 0 to 4. In other words, there is an effect of reducing the output dispersion of the apparatus for detecting timing error according to the SNR.

In addition, while the loop jitter value is constant even though the SNR increases according to the conventional apparatus for detecting timing error, the loop jitter value decreases as the SNR increases according to the present invention. Therefore, when the conventional phase locked loop is used even though the SNR increases, due to the effect of the jitter, an unwanted noise such as tickling sound having a certain level and form is generated in an audio signal reproduced from the disk-type recording medium. However, if the phase locked loop according to the present invention is used, as the SNR is high, the effect of the jitter is reduced, thus, there is an effect of remarkably reducing the sound deterioration of the audio signal reproducing from the disk type recording medium.

So far, the preferred embodiment of the present invention has been illustrated and described. However, the present invention is not limited to the preferred embodiment described here, and someone skilled in the art can modify the present invention without departing from the spirit and scope of the present invention claimed in the appended claims.

What is claimed is:

1. A phase locked loop circuit, comprising:
   an A/D converter for converting signals that are consecutively input into digital signals;
   a phase error detect unit for detecting a zero crossing of the digital signals and for detecting a timing error from the digital signal corresponding to the zero crossing; and
   an error correction unit for correcting a sampling timing of the A/D converter corresponding to the timing error, the phase error detecting unit comprising:

a zero crossing detect unit for detecting the zero crossing of the digital signals consecutively input from the A/D converter;

a switching unit for transmitting the digital signals input from the A/D converter when a zero crossing detect signal is input from the zero crossing detect unit; and an error calculate unit for obtaining and outputting the timing error between an input timing of a present digital signal input from the switching unit and an input timing of a previous digital -signal for the present digital signal.

2. The phase locked loop circuit of claim 1, wherein the zero crossing detect unit detects the zero crossing from a sign bit of the digital signals consecutively input from the A/D converter.

3. A The phase locked loop circuit of claim 2, wherein the error calculate unit comprises:

a buffer unit for storing the present digital signal and the previous digital signal corresponding to the zero crossing input from the switching unit;

a quantization unit for determining a direction of the phase error by judging a sign of the present digital signal; and a calculate unit for calculating an error from signals output from the buffer unit and the quantization unit.

4. The phase locked loop circuit of claim 3, wherein the calculate unit obtains the timing error based on $Z_k = Ba_{k\_1}(D1_k + D2_k - D1_{k\_1} - D2_{k\_1})$, and $Z_k$ is the timing error, B is a gain, $D1_k$ is the present digital signal that a (k)th zero crossing is generated therein, $D2_k$ is the previous digital signal that a (k)th zero crossing is generated therein, $a_{k\_1}$ is a level quantized value of the previous digital signal that a (k−1)th zero crossing is generated therein, and k is 1, 2, 3, 4, 5, 6, 7, . . . , n, . . . (n: natural numbers).

5. The phase locked loop circuit of claim 1, wherein the error calculate unit comprises:

a buffer unit for storing the present digital signal and the previous digital signal corresponding to the zero crossing input from the switching unit;

a quantization unit for determining a direction of the phase error by judging a sign of the present digital signal; and a calculate unit for calculating an error from signals output from the buffer unit and the quantization unit.

6. The phase locked loop circuit of claim 5, wherein the calculate unit obtains the timing error based on $Z_k = Ba_{k\_1}(D1_k + D2_k - D1_{k\_1} - D2_{k\_1})$, and $Z_k$ is the timing error, B is a gain, $D1_k$ is the present digital signal that a (k)th zero crossing is generated therein, $D2_k$ is the previous digital signal that a (k)th zero crossing is generated therein, $ak\_1$ is a 2-level quantized value of the previous digital signal that a (k−1)th zero crossing is generated therein, and k is 1, 2, 3, 4, 5, 6, 7, . . . , n, . . . (n: natural numbers).

7. The phase locked loop circuit of claim 1, further comprising an interpolation unit for outputting an average of a signal output from the A/D converter after the sampling timing is corrected.

8. An apparatus for detecting a phase error, comprising:

a zero crossing detect unit for detecting a zero crossing of digital signals consecutively input;

a switching unit for transmitting the input digital signals when the zero crossing is detected by the zero crossing detect unit; and an error calculate unit for obtaining and outputting timing error between an input timing of a present digital signal input from the switching unit and an input timing of a previous digital signal for the present digital signal.

9. The apparatus for detecting a phase error of claim 8, wherein the zero crossing detect unit detects the zero crossing from a sign bit of the digital signals consecutively input.

10. The apparatus for detecting a phase error of claim 9, wherein the zero crossing detect unit detects the zero crossing by using an exclusive OR of the sign bit of the digital signals consecutively input.

11. The apparatus for detecting a phase error of claim 10, wherein the error calculate unit comprises:

a relay unit for storing the present digital signal and the previous digital signal corresponding to the zero crossing input through the switching unit;

a quantization unit for determining a direction of the phase error by judging a sign of the present digital signal; and a calculate unit for calculating an input timing error from the signals output from the relay unit and the quantization unit.

12. The apparatus for detecting a phase error of claim 11 wherein the calculate unit obtains the timing error based on $Z_k = Ba_{k-1}(D1_k + D2_k - D1_{k-1} - D2_{k-1})$, and $Z_k$ is the timing error, B is a gain, $D1_k$ is the present digital signal that a (k)th zero crossing is generated therein, $D2_k$ is the previous digital signal that a (k)th zero crossing is generated therein, $a_{k-1}$ is a 2-level quantized value of the previous digital signal that a (k−1)th zero crossing is generated therein, and k is 1, 2, 3, 4, 5, 6, 7, . . . , n, . . . (n: natural numbers).

13. The apparatus for detecting a phase error of claim 8, wherein the error calculate unit comprises:

a relay unit for storing the present digital signal and the previous digital signal corresponding to the zero crossing input through the switching unit;

a quantization unit for determining a direction of the phase error by judging a sign of the present digital signal; and a calculate unit for calculating an input timing error from the signals output from the relay unit and the quantization unit.

14. The apparatus for detecting a phase error of claim 13, wherein the calculate unit obtains the timing error based on $Z_k = Ba_{k-1}D1_k + D2_k - D1_{k-1} - D2_{k-1})$, and $z_k$ is the timing error, B is a gain, $D1_k$ is the present digital signal that a (k)th zero crossing is generated therein, $D2_k$ is the previous digital signal that a (k)th zero crossing is generated therein, $a_{k-1}$ is a quantized value of the previous digital signal that a (k−1)th zero crossing is generated therein, and k is 1, 2, 3, 4, 5, 6, 7, . . . , n, . . . (n: natural numbers).

15. A phase locked loop circuit, comprising:

an A/D converter for converting signals that are consecutively input into digital signals;

a phase error detect unit for detecting a zero crossing of the digital signals and for detecting a timing error from the digital signal corresponding to the zero crossing; and an error correction unit for correcting a sampling timing of the A/D converter corresponding to the timing error; and an interpolation unit for outputting an average of a signal output from the A/D converter after the sampling timing is corrected.

* * * * *